US010530313B2

(12) United States Patent
Lee et al.

(10) Patent No.: US 10,530,313 B2
(45) Date of Patent: Jan. 7, 2020

(54) AMPLIFICATION DEVICE AND RELAY APPARATUS INCLUDING THE SAME

(71) Applicant: SOLiD, INC., Seongnam-si, Gyeonggi-do (KR)

(72) Inventors: Hwansun Lee, Bucheon-si (KR); Jitaek Park, Seoul (KR)

(73) Assignee: SOLiD, INC., Seongnam-si (KR)

( * ) Notice: Subject to any disclaimer, the term of this patent is extended or adjusted under 35 U.S.C. 154(b) by 175 days.

(21) Appl. No.: 15/540,668

(22) PCT Filed: Dec. 30, 2015

(86) PCT No.: PCT/KR2015/014534
§ 371 (c)(1),
(2) Date: Sep. 18, 2017

(87) PCT Pub. No.: WO2016/108647
PCT Pub. Date: Jul. 7, 2016

(65) Prior Publication Data
US 2018/0358936 A1    Dec. 13, 2018

(30) Foreign Application Priority Data

Dec. 30, 2014    (KR) .................. 10-2014-0194363

(51) Int. Cl.
*H03F 1/14*      (2006.01)
*H03F 1/52*      (2006.01)
(Continued)

(52) U.S. Cl.
CPC ............. *H03F 1/52* (2013.01); *H03F 1/0288* (2013.01); *H03F 3/68* (2013.01); *H03F 2200/426* (2013.01)

(58) Field of Classification Search
CPC . H03F 1/52; H03F 1/0288; H03F 1/02; H03F 3/68; H03F 2200/426; H04B 7/15535
(Continued)

(56) References Cited

U.S. PATENT DOCUMENTS 7,352,239 B2 *   4/2008  Lee ...................... H03F 1/0288
                                                        330/124 D
7,456,687 B2 *  11/2008  Seino ................... H03F 1/0288
                                                        330/124 R
(Continued)

FOREIGN PATENT DOCUMENTS

JP    2007-300528 A    11/2007
KR   10-2006-0064399 A   6/2006

OTHER PUBLICATIONS

Notice to Submit Response issued in the Korean Patent Office dated Nov. 29, 2016, along with an English translation thereof.

*Primary Examiner* — Khanh V Nguyen
(74) *Attorney, Agent, or Firm* — Sughrue Mion, PLLC

(57) ABSTRACT

According to one mode of the inventive concept, an amplification device includes a first amplification unit configured to amplify an input signal when a power level of the input signal is within a first range, a second amplification unit configured to amplify the input signal when the power level of the input signal is within a second range, and an abnormality sensing unit configured to sense an occurrence of an abnormality in the second amplification unit. The abnormality sensing unit senses reverse power regarding an output of the second amplification unit to generate a sensed voltage and compares the sensed voltage with a reference voltage to sense whether an abnormality occurs in the second amplification unit.

11 Claims, 8 Drawing Sheets

(51) Int. Cl.
*H03F 3/68* (2006.01)
*H03F 1/02* (2006.01)

(58) Field of Classification Search
USPC .................. 330/53, 54, 66, 124 R, 286, 295
See application file for complete search history.

(56) References Cited

U.S. PATENT DOCUMENTS

2006/0119428 A1 6/2006 Lee et al.
2007/0285158 A1 12/2007 Seino et al.
2009/0243626 A1* 10/2009 Maeda .................. H03F 1/0288
324/537

* cited by examiner

US 10,530,313 B2

AMPLIFICATION DEVICE AND RELAY APPARATUS INCLUDING THE SAME

CROSS-REFERENCE TO RELATED APPLICATIONS

This application is a National Stage of International Application No. PCT/KR2015/014534, filed Dec. 30, 2015, and claims priority from Korean Patent Application No. 10-2014-0194363, filed Dec. 30, 2014, the contents of which are incorporated herein by reference in their entireties.

BACKGROUND

1. Field

The inventive concept relates to an amplification device and a relay apparatus including the same, and more particularly, to an amplification device including at least two amplifiers and a relay apparatus including the amplification device.

2. Description of the Related Art

A Doherty amplification device is used to increase amplification efficiency. The Doherty amplification device uses two types of amplifiers, for example, a carrier amplifier and a peaking amplifier, and amplifies low power level signals using the carrier amplifier and high power level signals using the peaking amplifier. The Doherty amplification device uses an appropriate amplifier according to the power level of an input signal, thereby enhancing power use efficiency.

However, the Doherty amplification device has a problem in that even when normal output cannot be produced because an abnormality occurs in an internal transistor of a peaking amplifier, this abnormality is difficult to be detected. The reason is that a usage rate of a peaking amplifier is lower than a usage rate of a carrier amplifier since signals are normally amplified using the carrier amplifier.

When an abnormality occurs in a peaking amplifier, it may adversely affect the output power and adjacent channel leakage ratio (ACLR) of an apparatus, in which an amplification device is installed, for example, a relay apparatus relaying communication between a base station and a user or a node unit constituting a distributed antenna system, so that the service quality of the apparatus including the amplification device may be decreased. Therefore, it is important to quickly sense whether an abnormality occurs in a peaking amplifier and compensate for the abnormality in the Doherty amplification device.

SUMMARY

Embodiments of the inventive concept provide an amplification device and a relay apparatus including the same, in which whether an abnormality occurs in one of at least two amplifiers is sensed and the abnormality is compensated for.

According to an aspect of the inventive concept, there is provided an amplification device includes a first amplification unit configured to amplify an input signal when a power level of the input signal is within a first range; a second amplification unit configured to amplify the input signal when the power level of the input signal is within a second range; and an abnormality sensing unit configured to sense an occurrence of an abnormality in the second amplification unit, wherein the abnormality sensing unit senses reverse power regarding an output of the second amplification unit to generate a sensed voltage and compares the sensed voltage with a reference voltage to sense whether an abnormality occurs in the second amplification unit.

According to an exemplary embodiment, the abnormality sensing unit may include a dividing part configured to divide the output of the second amplification unit; a sensing part configured to sense the reverse power regarding the output of the second amplification unit based on a divided output of the second amplification unit and to generate the sensed voltage; and a comparator circuit part configured to compare the sensed voltage with the reference voltage and to sense whether an abnormality occurs in the second amplification unit.

According to an exemplary embodiment, the amplification device may further include a first switch unit disposed between an input node and an input terminal of the second amplification unit to control connection or disconnection between the input node and the second amplification unit, wherein the input node connects an input terminal of the first amplification unit with the input terminal of the second amplification unit.

According to an exemplary embodiment, the first switch unit may switch connection between a first input terminal connected to the input node and a first output terminal connected to the input terminal of the second amplification unit and connection between the first input terminal and a second output terminal connected to a ground, and when the abnormality sensing unit senses the occurrence of the abnormality in the second amplification unit, the first switch unit may connect the first input terminal to the second output terminal.

According to an exemplary embodiment, the amplification device may further include a second switch unit disposed between an output node and an output terminal of the second amplification unit to control connection or disconnection between the output node and the output terminal of the second amplification unit, wherein the output node connects an output terminal of the first amplification unit with the output terminal of the second amplification unit.

According to an exemplary embodiment, the second switch unit may switch connection between a second input terminal connected to the output terminal of the second amplification unit and a third output terminal connected to the output node and connection between the second input terminal and a fourth output terminal connected to a ground, and when the abnormality sensing unit senses the occurrence of the abnormality in the second amplification unit, the second switch unit may connect the second input terminal to the fourth output terminal.

According to another aspect of the inventive concept, there is provided a relay apparatus includes an amplification device comprising a first amplification unit configured to amplify an input signal when a power level of the input signal is within a first range, a second amplification unit configured to amplify the input signal when the power level of the input signal is within a second range, and an abnormality sensing unit configured to sense an occurrence of an abnormality in the second amplification unit; and a controller configured to receive a sensing result from the abnormality sensing unit and to compensate for the abnormality of the second amplification unit when the sensing result indicates the occurrence of the abnormality in the second amplification unit, wherein the abnormality sensing unit senses reverse power regarding an output of the second amplification unit to generate a sensed voltage and compares the sensed voltage with a reference voltage to sense whether an abnormality occurs in the second amplification unit.

According to an exemplary embodiment, the relay apparatus may further include an attenuator connected to an input node connecting an input terminal of the first amplification unit with an input terminal of the second amplification unit, wherein the controller may compensate for the abnormality of the second amplification unit by controlling the attenuator to reduce power of the input signal when the sensing result indicates the occurrence of the abnormality in the second amplification unit.

According to an exemplary embodiment, the abnormality sensing unit may include a dividing part configured to divide the output of the second amplification unit; a sensing part configured to sense the reverse power regarding the output of the second amplification unit based on a divided output of the second amplification unit and to generate the sensed voltage; and a comparator circuit part configured to compare the sensed voltage with the reference voltage and to sense whether an abnormality occurs in the second amplification unit.

According to an exemplary embodiment, the amplification device may further include a first switch unit disposed between an input node and an input terminal of the second amplification unit to control connection or disconnection between the input node and the second amplification unit, wherein the input node connects an input terminal of the first amplification unit with the input terminal of the second amplification unit; and the controller compensates for the abnormality of the second amplification unit by controlling the first switch unit to disconnect the input node from the second amplification unit when the sensing result indicates the occurrence of the abnormality in the second amplification unit.

According to an exemplary embodiment, the amplification device may further include a second switch unit disposed between an output node and an output terminal of the second amplification unit to control connection or disconnection between the output node and the output terminal of the second amplification unit, wherein the output node connects an output terminal of the first amplification unit with the output terminal of the second amplification unit; and the controller compensates for the abnormality of the second amplification unit by controlling the second switch unit to disconnect the output node from the output terminal of the second amplification unit when the sensing result indicates the occurrence of the abnormality in the second amplification unit.

According to embodiments of the inventive concept, an amplification device and a relay apparatus including the same sense in real time whether an abnormality occurs in one of at least two amplifiers and automatically compensate for the abnormality when it is sensed that the abnormality has occurred in one amplifier, thereby preventing degradation of service quality.

BRIEF DESCRIPTION OF THE FIGURES

The drawings referred to in the detailed description will be briefly described.

DETAILED DESCRIPTION OF EXEMPLARY EMBODIMENTS

The inventive concept may include various modifications and different embodiments. The detailed description will be set forth with reference to the drawings showing specific embodiments. However, the inventive concept will not be restricted to specifically disclosed features but will include any modifications, equivalents, or substitutes that do not depart from the scope of the inventive concept.

In the description of the inventive concept, when the detailed description of the known technology in the related art may blur the gist of the inventive concept, the detailed description will be omitted. Although terms such as first, second and the like may be used in the description of the embodiments, these terms are only used to distinguish one element from another.

It will be understood that when an element is referred to as being "connected" or "coupled" to another element, it can be directly connected or coupled to the other element or intervening elements may be present unless otherwise defined.

As used herein, terminology such as "part (or unit)", "~or", "~er", and "module" may indicate a unit which processes at least one function or operation and may be implemented by hardware, software, or a combination thereof.

It should be clearly understood that elements are just defined by their main functions. In detail, two or more elements may be integrated into one element or one element may be divided into two or more elements by their subdivided functions. Each of the elements which will be described below may partially or fully perform the function of another element in addition to its own main function and part of the main function of each element may be exclusively performed by another element.

Figure 1:
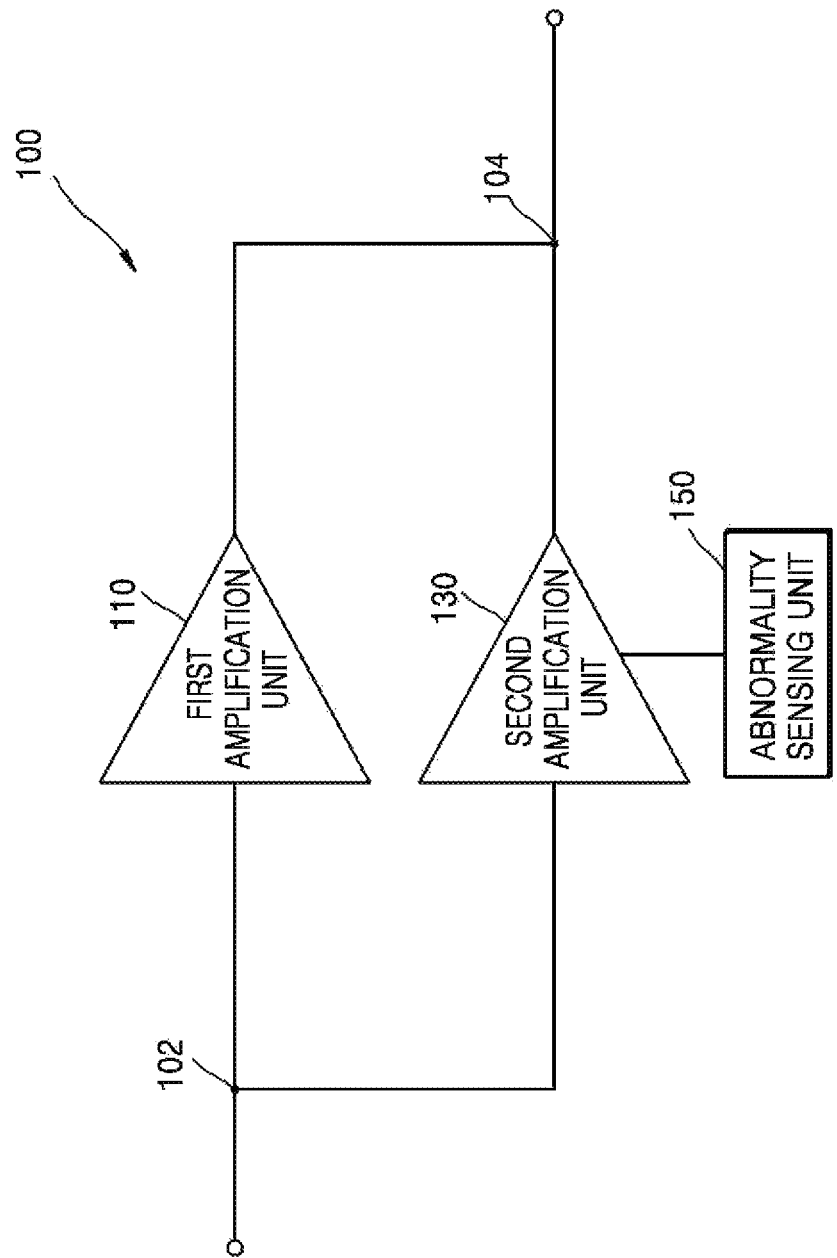
FIG. 1 is a diagram of the partial structure of an amplification device according to an embodiment of the inventive concept.

FIG. 1 is a diagram of the partial structure of an amplification device according to an embodiment of the inventive concept.

Referring to FIG. 1, an amplification device 100 may include a first amplification unit 110, a second amplification unit 130, and an abnormality sensing unit 150.

The first amplification unit 110 may be connected between an input node 102 and an output node 104. The first amplification unit 110 may receive an input signal branching out from the input node 102. The first amplification unit 110 may amplify the input signal when a power level of the input signal is within a first range in which the power level of the input signal may be greater than 0 and not exceed a predetermined peak-to-average power ratio (PAPR).

The second amplification unit 130 may be connected between the input node 102 and the output node 104 to be parallel to the first amplification unit 110. The second amplification unit 130 may receive an input signal branching out from the input node 102. The second amplification unit 130 may amplify the input signal when a power level of the input signal is within a second range in which the power level of the input signal may be greater than the predetermined PAPR and not exceed the limit of the second amplification unit 130.

Here, the first amplification unit 110 may correspond to a carrier amplifier and the second amplification unit 130 may correspond to a peaking amplifier, and therefore, the amplification device 100 may operate as a Doherty amplification device.

The abnormality sensing unit 150 may be connected to the second amplification unit 130 and may sense in real time whether an abnormality occurs in the second amplification unit 130. The abnormality sensing unit 150 will be described in detail with reference to FIGS. 2 and 3 later.

The amplification device 100 may sense in real time whether an abnormality occurs in the second amplification unit 130 using the abnormality sensing unit 150, thereby preventing quality degradation caused in wireless equipment, in which the amplification device 100 is installed, for example, a relay apparatus or a node unit (such as a headend unit, an extension unit, or a remote unit) forming a distributed antenna system (DAS), when the second amplification unit 130 does not amplify an input signal normally.

Figure 2:
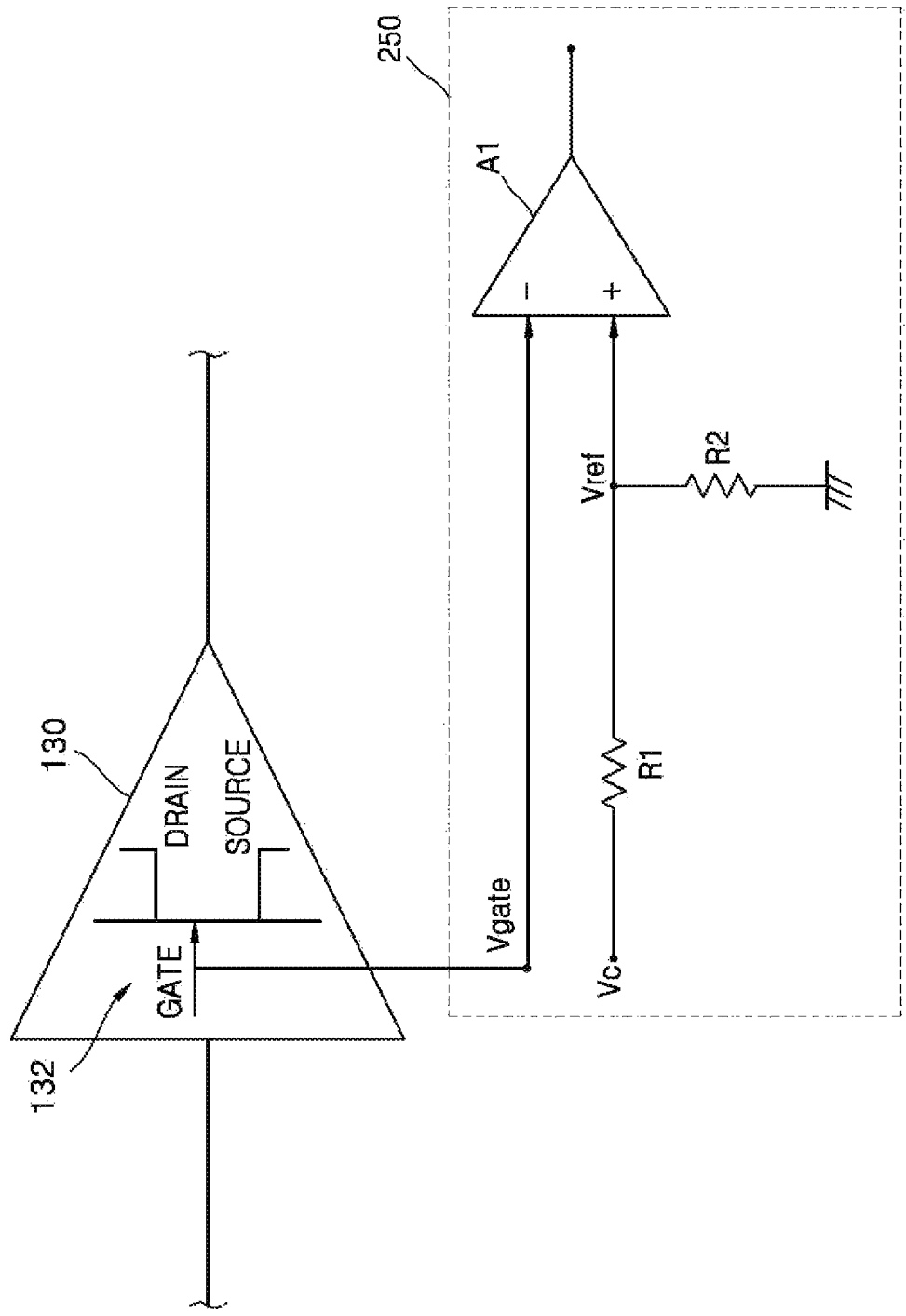
FIG. 2 is a detailed diagram of an example of an abnormality sensing unit shown in FIG. 1.

FIG. 2 is a detailed diagram of an example of an abnormality sensing unit shown in FIG. 1.

Referring to FIG. 2, an abnormality sensing unit 250 may include a comparator circuit part which includes a first resistor R1, a second resistor R2, and an amplifier A1. The comparator circuit part may be configured so that an input voltage Vc is converted into a reference voltage Vref by the first and second resistors R1 and R2, the reference voltage Vref is provided to a first input terminal of the amplifier A1, and a gate voltage Vgate of a metal oxide semiconductor (MOS) transistor 132 included in the second amplification unit 130 is provided to a second input terminal of the amplifier A1. Accordingly, the abnormality sensing unit 250 may compare the gate voltage Vgate of the MOS transistor 132 with the reference voltage Vref and sense whether an abnormality occurs in the second amplification unit 130.

The abnormality sensing unit 250 may sense that an abnormality has occurred in the second amplification unit 130 when the gate voltage Vgate is less than the reference voltage Vref. When an abnormality occurs in the second amplification unit 130, a normal gate voltage (e.g., +1 V in case of laterally diffused MOS (LDMOS) type or ~1.5 V in case of gallium nitride (GaN) type) is decreased. Accordingly, the abnormality sensing unit 250 may detect that an abnormality has occurred in the second amplification unit 130 when it is determined that the gate voltage Vgate is less than the reference voltage Vref as a result of comparing the gate voltage Vgate with the reference voltage Vref.

Figure 3:
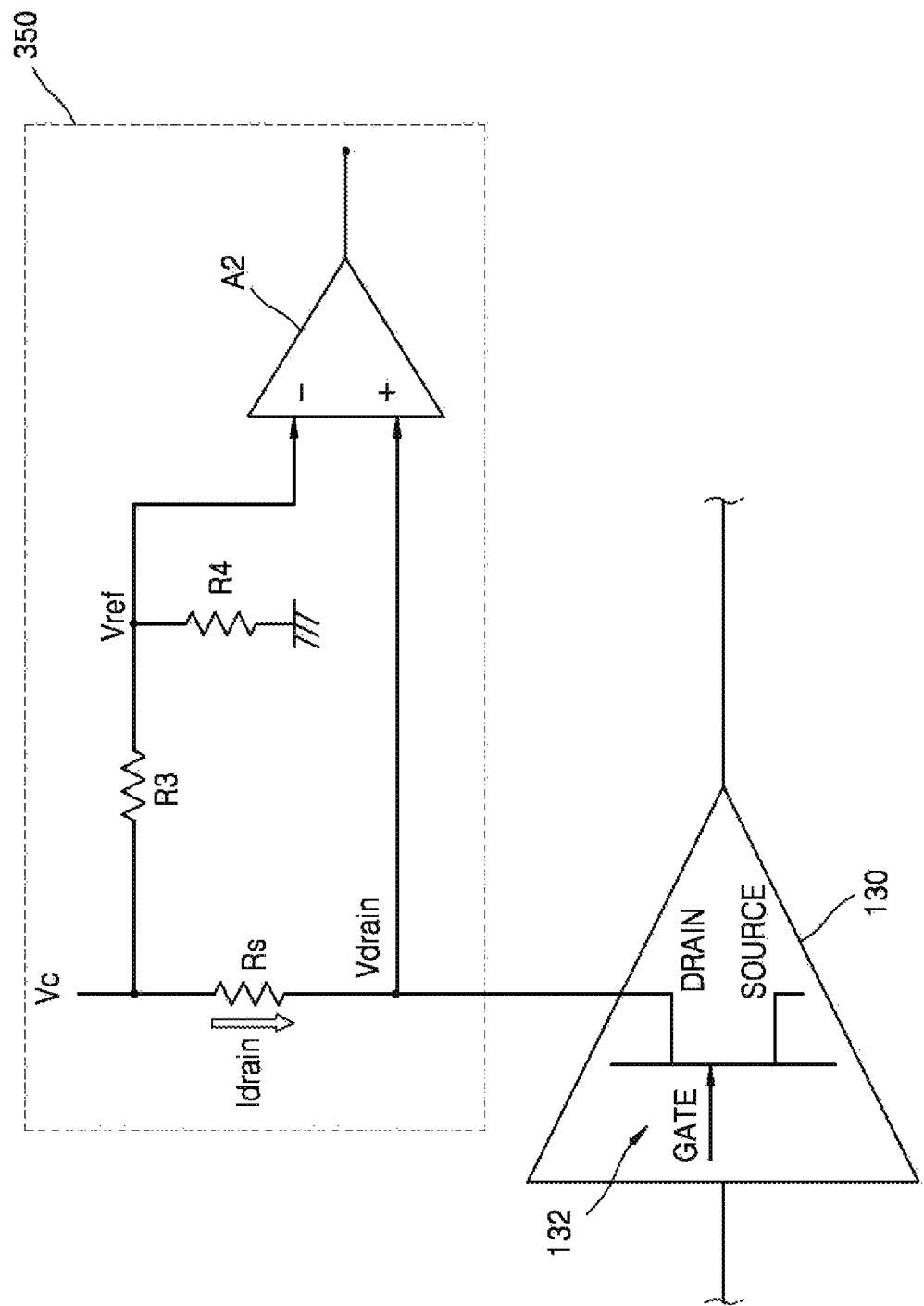
FIG. 3 is a detailed diagram of another example of the abnormality sensing unit shown in FIG. 1.

FIG. 3 is a detailed diagram of another example of the abnormality sensing unit shown in FIG. 1.

Referring to FIG. 3, an abnormality sensing unit 350 may include a comparator circuit part which includes a sensing resistor Rs, a third resistor R3, a fourth resistor R4, and an amplifier A2. The comparator circuit part may be configured so that a drain voltage Vdrain of the MOS transistor 132 included in the second amplification unit 130, e.g., a voltage obtained after the input voltage Vc is dropped by the sensing resistor Rs, is provided to a first input terminal of the amplifier A2, the input voltage Vc is converted into the reference voltage Vref by the third and fourth resistors R3 and R4, and the reference voltage Vref is provided to a second input terminal of the amplifier A2. Accordingly, the abnormality sensing unit 350 may compare the drain voltage Vdrain with the reference voltage Vref and sense whether an abnormality occurs in the second amplification unit 130.

The abnormality sensing unit 350 may detect that an abnormality has occurred in the second amplification unit 130 when the drain voltage Vdrain is greater than the reference voltage Vref. When an abnormality occurs in the second amplification unit 130, a drain current Idrain is decreased and the magnitude of the input voltage Vc dropped by the sensing resistor Rs is also decreased, and therefore, the magnitude of the drain voltage Vdrain is increased. As a result, the abnormality sensing unit 350 may detect that an abnormality has occurred in the second amplification unit 130 when it is determined that the drain voltage Vdrain is greater than the reference voltage Vref as a result of comparing the drain voltage Vdrain with the reference voltage Vref.

Figure 4:
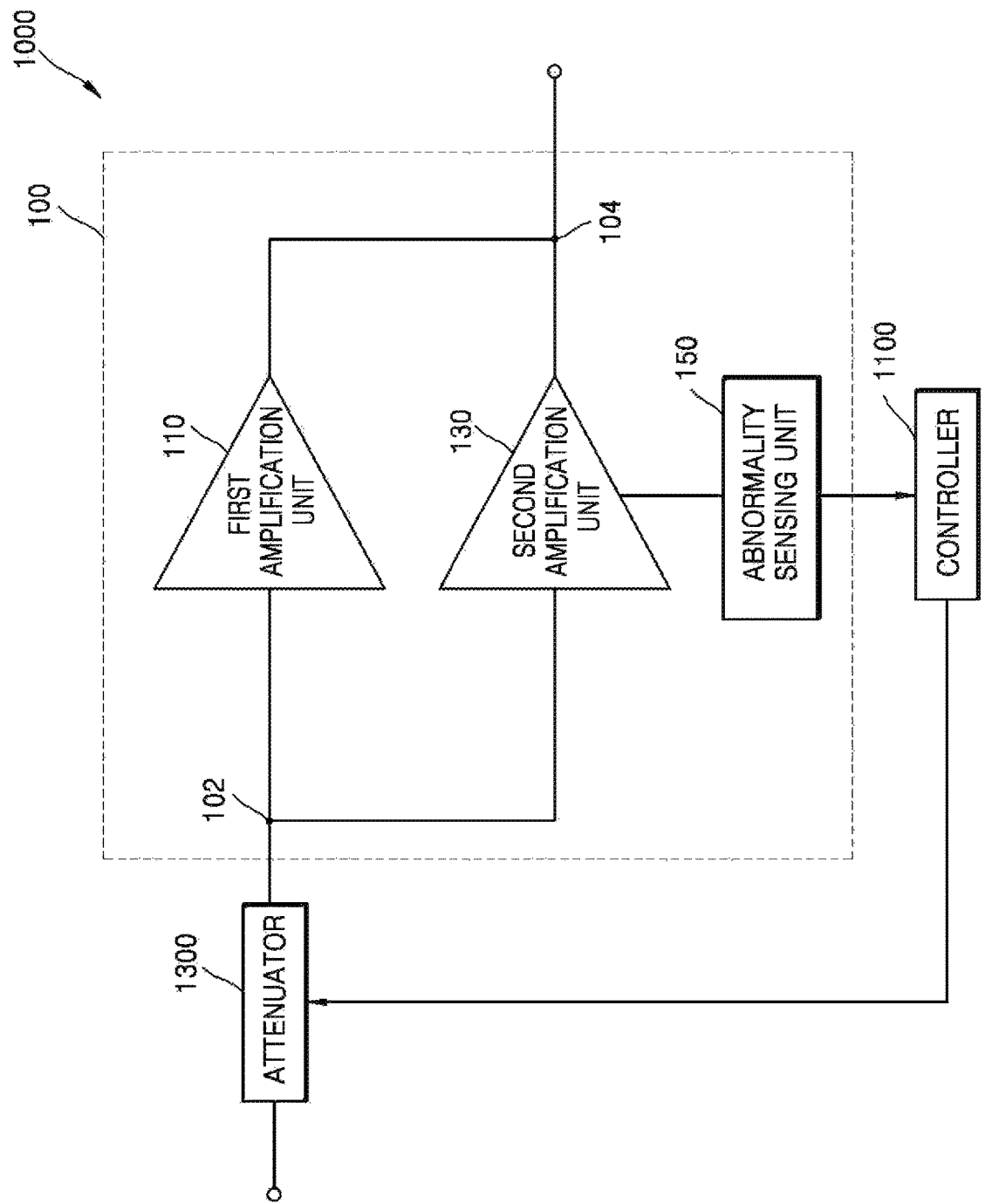
FIG. 4 is a diagram of the partial structure of a relay apparatus according to an embodiment of the inventive concept.

FIG. 4 is a diagram of the partial structure of a relay apparatus according to an embodiment of the inventive concept. A relay apparatus 1000 shown in FIG. 4 may include the amplification device 100 shown in FIGS. 1 through 3. For convenience's sake, redundant description will be omitted. The relay apparatus 1000 may be a wireless repeater which transmits a base station signal from a base station to a user terminal after performing signal processing, e.g., filtering or amplification, on the base station signal but is not limited thereto. The relay apparatus 1000 may be a communication device such as a remote unit forming a DAS.

Referring to FIG. 4, the relay apparatus 1000 may include the amplification device 100, a controller 1100, and an attenuator 1300.

The controller 1100 may receive a sensing result from the abnormality sensing unit 150. When the sensing result from the abnormality sensing unit 150 indicates an occurrence of an abnormality in the second amplification unit 130, the controller 1100 may compensate for the abnormality of the second amplification unit 130.

For example, when the sensing result from the abnormality sensing unit 150 indicates that an abnormality has occurred in the second amplification unit 130, the controller 1100 may control the attenuator 1300 to adjust the power level of an input signal of the amplification device 100 to be within the first range so that the input signal is amplified by only the first amplification unit 110 not the second amplification unit 130, thereby compensating for the abnormality of the second amplification unit 130. The controller 1100 may be an element managing and controlling other elements of the relay apparatus 1000 but is not limited thereto. The controller 1100 may be replaced with a control element implemented in a single module together with the amplification device 100.

The attenuator 1300 may be connected to a front end of the input node 102 of the amplification device 100. When an abnormality occurs in the second amplification unit 130, the attenuator 1300 may reduce the power of an input signal input to the amplification device 100 under the control of the controller 1100.

When an abnormality occurs in the second amplification unit 130, the relay apparatus 1000 may adjust the power of an input signal so that the input signal is amplified by only the first amplification unit 110, thereby maintaining a service quality factor, e.g., an adjacent channel leakage ratio (ACLR), required for the relay apparatus 1000 to be satisfactory.

Although not shown in FIG. 4, the relay apparatus 1000 may also include an output unit which receives a sensing result from the abnormality sensing unit 150 and informs a user of the sensing result. The output unit may include a device, such as a speaker, a monitor, or a printer, which outputs predetermined information.

Figure 5:
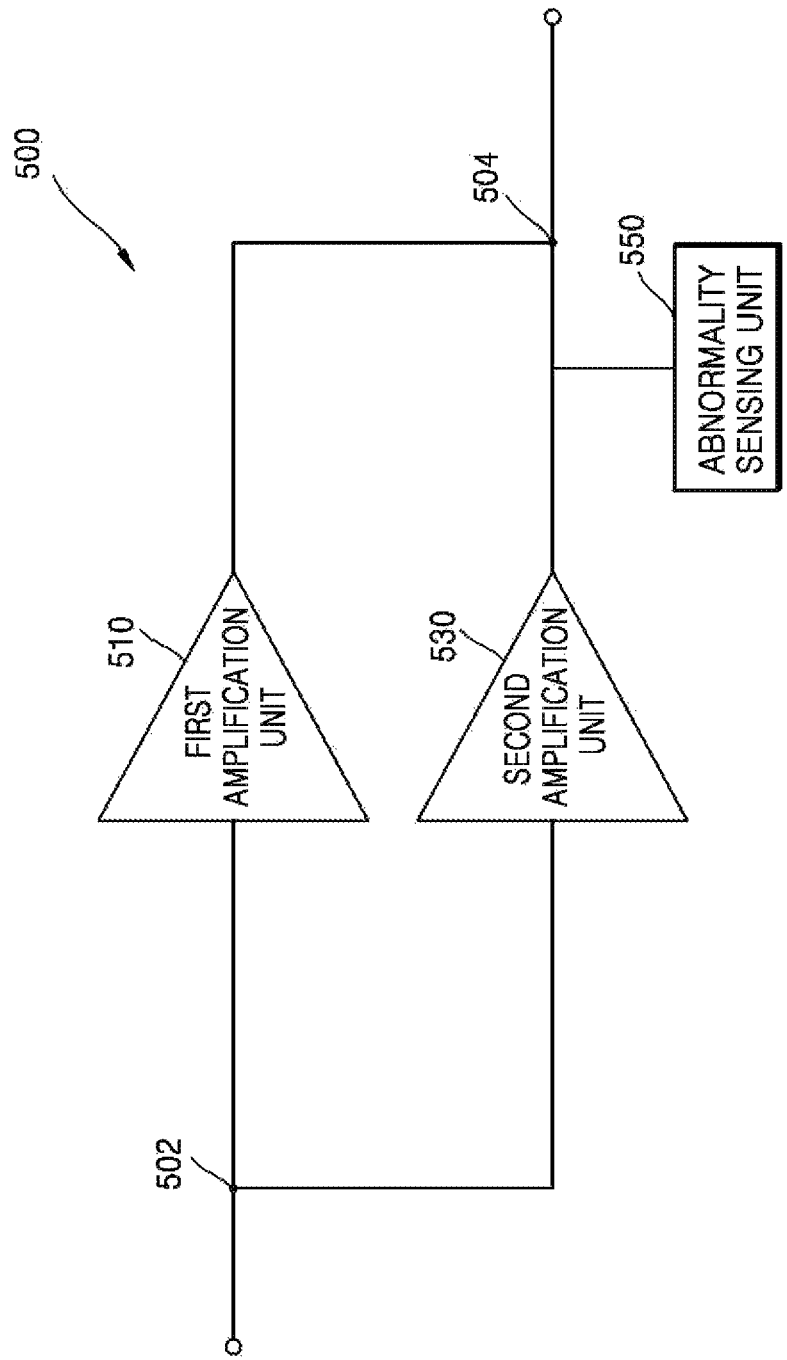
FIG. 5 is a diagram of the partial structure of an amplification device according to another embodiment of the inventive concept.

FIG. 5 is a diagram of the partial structure of an amplification device according to another embodiment of the inventive concept.

Referring to FIG. 5, an amplification device 500 may include a first amplification unit 510, a second amplification unit 530, and an abnormality sensing unit 550.

The first amplification unit 510 may be connected between an input node 502 and an output node 504 and may receive an input signal branching out from the input node 502. The first amplification unit 510 may amplify the input signal when a power level of the input signal is within a first range in which the power level of the input signal may be greater than 0 and not exceed a predetermined PAPR.

The second amplification unit 530 may be connected between the input node 502 and the output node 504 to be parallel to the first amplification unit 510 and may receive an input signal branching out from the input node 502. The second amplification unit 530 may amplify the input signal when a power level of the input signal is within a second range in which the power level of the input signal may be greater than the predetermined PAPR and not exceed the limit of the second amplification unit 530.

Here, the first amplification unit 510 may correspond to a carrier amplifier and the second amplification unit 530 may correspond to a peaking amplifier, and therefore, the amplification device 500 may operate as a Doherty amplification device.

The abnormality sensing unit 550 may be connected to an output terminal of the second amplification unit 530. The abnormality sensing unit 550 may sense a change in impedance of the second amplification unit 530 based on reverse power regarding an output of the second amplification unit 530 to sense in real time whether an abnormality occurs in the second amplification unit 530. The abnormality sensing unit 550 will be described in detail with reference to FIG. 6 later.

The amplification device 500 may sense in real time whether an abnormality occurs in the second amplification unit 530 using the abnormality sensing unit 550, thereby preventing quality degradation caused in wireless equipment, e.g., a relay apparatus, in which the amplification device 500 is installed, because the second amplification unit 530 does not amplify an input signal normally.

Figure 6:
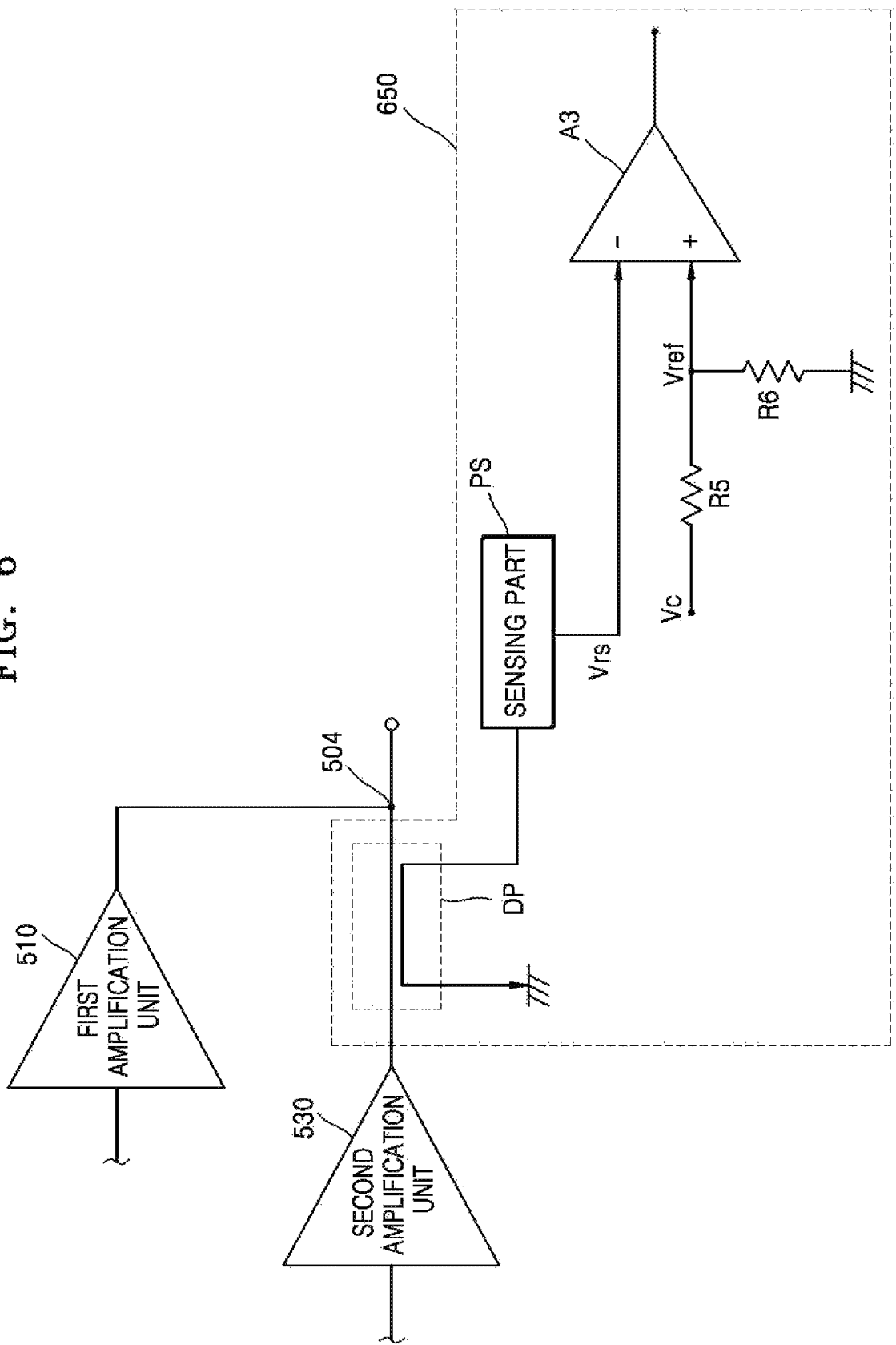
FIG. 6 is a detailed diagram of an example of an abnormality sensing unit shown in FIG. 5.

FIG. 6 is a detailed diagram of an example of an abnormality sensing unit shown in FIG. 5.

Referring to FIG. 6, an abnormality sensing unit 650 may include a dividing part DP, a sensing part PS, and a comparator circuit part. The comparator circuit part may include a fifth resistor R5, a sixth resistor R6, and an amplifier A3.

The dividing part DP may be disposed between the output terminal of the second amplification unit 530 and the output node 504. The dividing part DP may be configured to divide an output of the second amplification unit 530. The dividing part DP may be implemented as, for example, a coupler and may couple the output terminal of the second amplification unit 530 to the abnormality sensing unit 650, but the inventive concept is not limited thereto. It is also apparent that the dividing part DP may be implemented as a power divider which divides the output of the second amplification unit 530.

The sensing part PS may sense reverse power regarding the output of the second amplification unit 530 through the dividing part DP. The sensing part PS may convert a sensed reverse power value into a sensed voltage Vrs and provide the sensed voltage Vrs to the comparator circuit part.

The comparator circuit part may be configured so that the input voltage Vc is converted into the reference voltage Vref by the fifth and sixth resistors R5 and R6, the reference voltage Vref is provided to a first input terminal of the amplifier A3, and the sensed voltage Vrs is transmitted from the sensing part PS to a second input terminal of the amplifier A3. The comparator circuit part may compare the reference voltage Vref with the sensed voltage Vrs and sense whether an abnormality occurs in the second amplification unit 530.

The abnormality sensing unit 650 may sense that an abnormality has occurred in the second amplification unit 530 when the sensed voltage Vrs is greater than the reference voltage Vref. When an abnormality occurs in the second amplification unit 530, the impedance of the second amplification unit 530 is low, close to 0 ohms, and the output of the second amplification unit 530 increases, and therefore, reverse power, i.e., the sensed voltage Vrs, increases. Consequently, when the sensed voltage Vrs is greater than the reference voltage Vref, the abnormality sensing unit 650 may determine that an abnormality has occurred in the second amplification unit 530.

Figure 7:
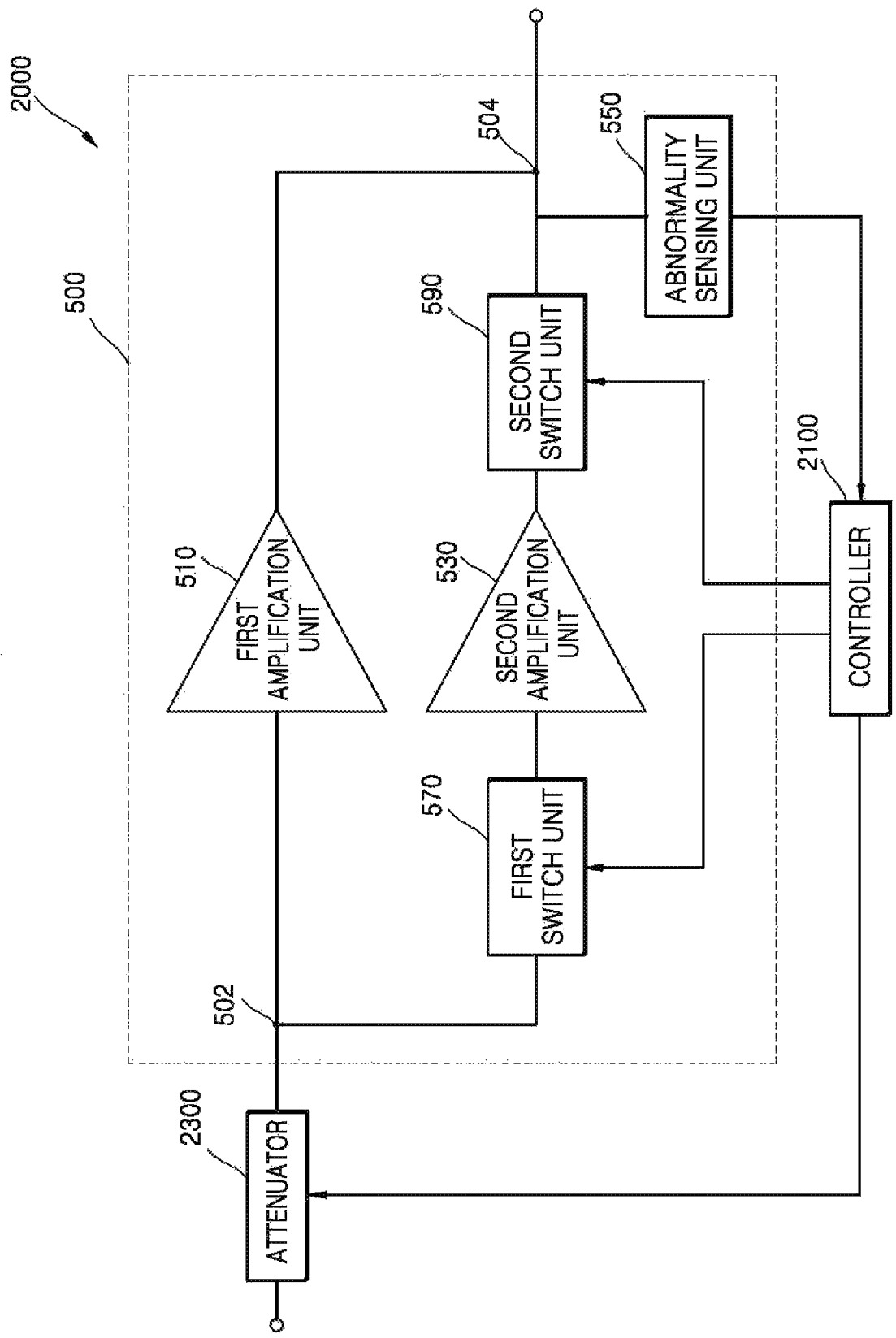
FIG. 7 is a diagram of the partial structure of a relay apparatus according to another embodiment of the inventive concept.

FIG. 7 is a diagram of the partial structure of a relay apparatus according to another embodiment of the inventive concept. A relay apparatus 2000 shown in FIG. 7 may include the amplification device 500 shown in FIGS. 5 and 6. For convenience's sake, redundant description will be omitted. The relay apparatus 2000 may be a wireless repeater which transmits a base station signal from a base station to a user terminal after performing signal processing, e.g., filtering or amplification, on the base station signal but is not limited thereto. The relay apparatus 2000 may be a communication device such as a remote unit forming a DAS. Unlike the amplification device 500 shown in FIGS. 5 and 6, the amplification device 500 shown in FIG. 7 may further include a first switch unit 570 and a second switch unit 590 to disconnect the second amplification unit 530 between the input node 502 and the output node 504 when the abnormality sensing unit 550 senses that an abnormality has occurred in the second amplification unit 530, so that normal output impedance is maintained. The first switch unit 570 and the second switch unit 590 will be described in detail with reference to FIG. 8 later.

Referring to FIG. 7, the relay apparatus 2000 may include the amplification device 500, a controller 2100, and an attenuator 2300.

The controller 2100 may receive a sensing result from the abnormality sensing unit 550. The controller 2100 may control connection or disconnection of the second amplification unit 530 in the amplification device 500 based on the sensing result from the abnormality sensing unit 550. In detail, the controller 2100 may receive a sensing result from the abnormality sensing unit 550. When the sensing result indicates that an abnormality has occurred in the second amplification unit 530, the controller 2100 may control at least one of the first and second switch units 570 and 590 to disconnect the second amplification unit 530 between the input node 502 and the output node 504, so that the abnormality of the second amplification unit 530 is compensated for.

Alternatively, when the sensing result from the abnormality sensing unit 550 indicates that an abnormality has occurred in the second amplification unit 530, the controller 2100 may control the attenuator 2300 to adjust the power level of an input signal of the amplification device 500 to be within the first range so that the input signal is amplified by only the first amplification unit 510 not the second amplification unit 530, thereby compensating for the abnormality of the second amplification unit 530.

Meanwhile, the controller 2100 may be an element managing and controlling other elements of the relay apparatus 2000 but is not limited thereto. The controller 2100 may be replaced with a control element implemented in a single module together with the amplification device 500.

The attenuator 2300 may be connected to a front end of the input node 502 of the amplification device 500. When an abnormality occurs in the second amplification unit 530, the attenuator 2300 may reduce the power of an input signal input to the amplification device 500 under the control of the controller 2100.

When it is determined that an abnormality has occurred in the second amplification unit 530 included in the amplification device 500, the relay apparatus 2000 may disconnect the second amplification unit 530 between the input node 502 and the output node 504, so that the second amplification unit 530 does not operate and simultaneously output impedance is maintained. As a result, the output loss of the first amplification unit 510 may be prevented, and therefore, degradation of service quality may also be prevented.

When an abnormality occurs in the second amplification unit 530, the relay apparatus 2000 may also adjust the power of an input signal so that the input signal is amplified by only the first amplification unit 510, thereby maintaining a service quality factor, e.g., an ACLR, required for the relay apparatus 2000 to be satisfactory.

Although not shown in FIG. 7, the relay apparatus 2000 may also include an output unit which receives a sensing result from the abnormality sensing unit 550 and informs a user of the sensing result. The output unit may include a device, such as a speaker, a monitor, or a printer, which outputs predetermined information.

Figure 8:
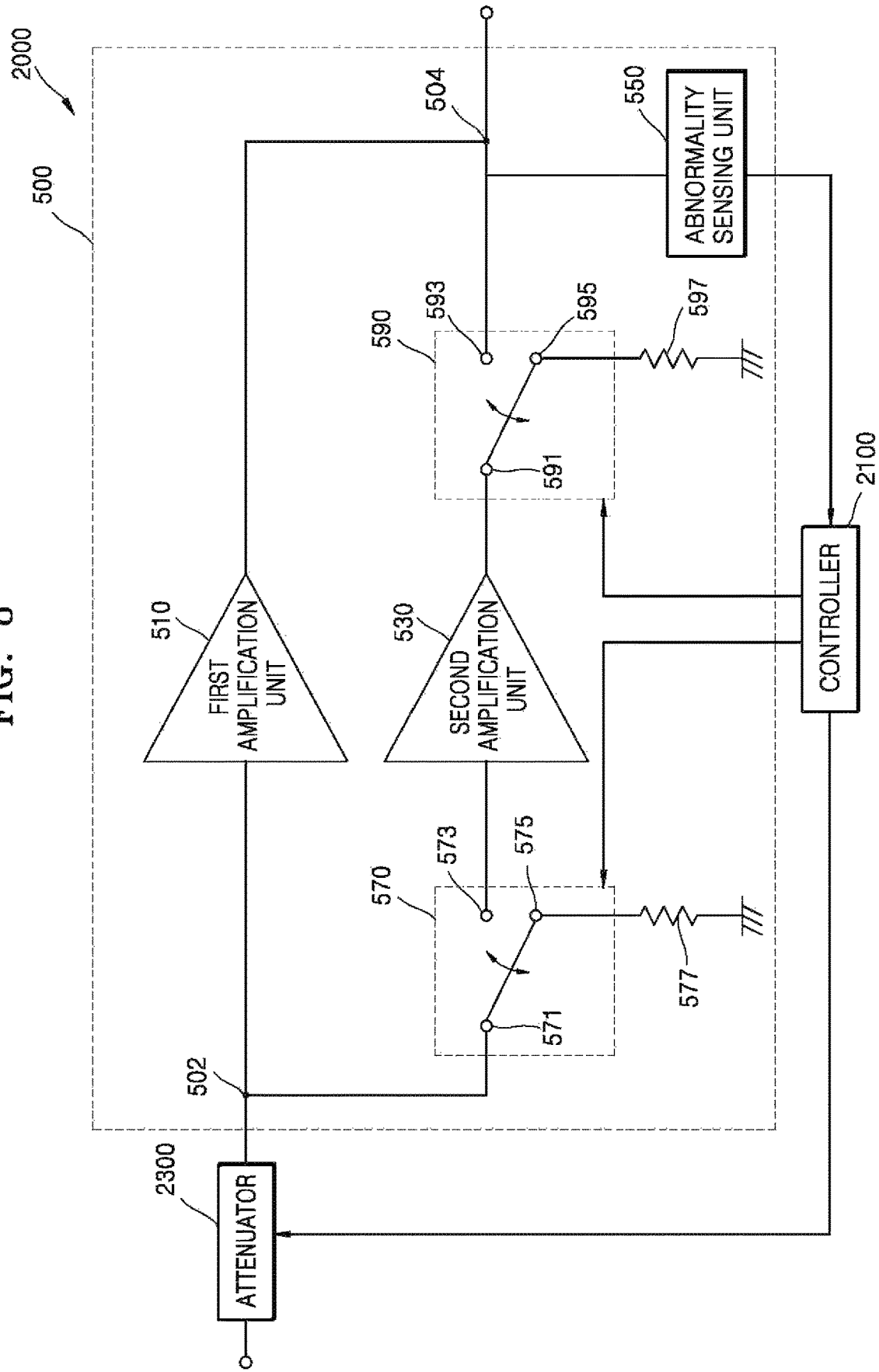
FIG. 8 is a diagram illustrating in detail switch units shown in FIG. 7.

FIG. 8 is a diagram illustrating in detail switch units shown in FIG. 7.

Referring to FIG. 8, the first switch unit 570 may be connected between the input node 502 and an input terminal of the second amplification unit 530. The first switch unit 570 may include an input terminal 571 connected to the input node 502, an output terminal 573 connected to the input terminal of the second amplification unit 530, and an output terminal 575 connected to a ground. A first terminating resistor 577 may be connected between the output terminal 575 of the first switch unit 570 and the ground.

The second switch unit 590 may be connected between an output terminal of the second amplification unit 530 and the output node 504. The second switch unit 590 may include an input terminal 591 connected to the output terminal of the second amplification unit 530, an output terminal 593 connected to the output node 504, and an output terminal 595 connected to the ground. A second terminating resistor 597 may be connected between the output terminal 595 of the second switch unit 590 and the ground.

The first switch unit 570 and the second switch unit 590 may control connection or disconnection of the second amplification unit 530 between the input node 502 and the output node 504 under the control of the controller 2100.

When the abnormality sensing unit 550 senses that the second amplification unit 530 is normal, the first switch unit 570 maintains the connection between the input terminal 571 and the output terminal 573 and the second switch unit 590 maintains the connection between the input terminal 591 and the output terminal 593, so that the connection of the second amplification unit 530 between the input node 502 and the output node 504 is maintained. Accordingly, an input signal may be amplified by the first amplification unit 510 or the second amplification unit 530 according to the power level thereof.

When the abnormality sensing unit 550 senses that an abnormality has occurred in the second amplification unit 530, the first switch unit 570 connects the input terminal 571 to the output terminal 575 and simultaneously the second switch unit 590 connects the input terminal 591 to the output terminal 595, so that the second amplification unit 530 is disconnected between the input node 502 and the output node 504. Accordingly, the second amplification unit 530 does not operate and output impedance is maintained at an optimal value. As a result, output of the first amplification unit 510 may not be lost.

Alternatively, when the abnormality sensing unit 550 senses that an abnormality has occurred in the second amplification unit 530, only the first switch unit 570 may connect the input terminal 571 to the output terminal 575 or only the second switch unit 590 may connect the input terminal 591 to the output terminal 595, so that the second amplification unit 530 may be disconnected between the input node 502 and the output node 504.

While the inventive concept has been particularly shown and described with reference to embodiments thereof, it will be understood that various changes in form and details may be made therein without departing from the spirit and scope of the following claims.

The invention claimed is:

1. An amplification device comprising:
   a first amplification unit configured to amplify an input signal when a power level of the input signal is within a first range;
   a second amplification unit configured to amplify the input signal when the power level of the input signal is within a second range; and
   an abnormality sensing unit configured to sense an occurrence of an abnormality in the second amplification unit,
   wherein the abnormality sensing unit senses a drain voltage of the second amplification unit and compares the drain voltage with a reference voltage to sense whether an abnormality occurs in the second amplification unit, and
   wherein the abnormality sensing unit detects that abnormality has occurred when the drain voltage is greater than the reference voltage.

2. The amplification device of claim 1, wherein the abnormality sensing unit comprises:
   a dividing part configured to divide an output of the second amplification unit;
   a sensing part configured to sense the drain voltage based on a divided output of the second amplification unit; and
   a comparator circuit part configured to compare the drain voltage with the reference voltage and to sense whether an abnormality occurs in the second amplification unit.

3. The amplification device of claim 1, further comprising a first switch unit disposed between an input node and an input terminal of the second amplification unit to control connection or disconnection between the input node and the second amplification unit,
   wherein the input node connects an input terminal of the first amplification unit with the input terminal of the second amplification unit.

4. The amplification device of claim 3, wherein the first switch unit switches connection between a first input terminal connected to the input node and a first output terminal connected to the input terminal of the second amplification unit and connection between the first input terminal and a second output terminal connected to a ground, and when the abnormality sensing unit senses the occurrence of the abnormality in the second amplification unit, the first switch unit connects the first input terminal to the second output terminal.

5. The amplification device of claim 1, further comprising a second switch unit disposed between an output node and an output terminal of the second amplification unit to control connection or disconnection between the output node and the output terminal of the second amplification unit, wherein the output node connects an output terminal of the first amplification unit with the output terminal of the second amplification unit.

6. The amplification device of claim 5, wherein the second switch unit switches connection between a second input terminal connected to the output terminal of the second amplification unit and a third output terminal connected to the output node and connection between the second input terminal and a fourth output terminal connected to a ground, and when the abnormality sensing unit senses the occurrence of the abnormality in the second amplification unit, the second switch unit connects the second input terminal to the fourth output terminal.

7. A relay apparatus comprising:

an amplification device comprising a first amplification unit configured to amplify an input signal when a power level of the input signal is within a first range, a second amplification unit configured to amplify the input signal when the power level of the input signal is within a second range, and an abnormality sensing unit configured to sense an occurrence of an abnormality in the second amplification unit; and a controller configured to receive a sensing result from the abnormality sensing unit and to compensate for the abnormality of the second amplification unit when the sensing result indicates the occurrence of the abnormality in the second amplification unit, wherein the abnormality sensing unit senses a drain voltage of the second amplification unit and compares the drain voltage with a reference voltage to sense whether an abnormality occurs in the second amplification unit, and wherein the abnormality sensing unit detects that abnormality has occurred when the drain voltage is greater than the reference voltage.

8. The relay apparatus of claim 7, further comprising an attenuator connected to an input node connecting an input terminal of the first amplification unit with an input terminal of the second amplification unit, wherein the controller compensates for the abnormality of the second amplification unit by controlling the attenuator to reduce power of the input signal when the sensing result indicates the occurrence of the abnormality in the second amplification unit.

9. The relay apparatus of claim 7, wherein the abnormality sensing unit comprises:

a dividing part configured to divide an output of the second amplification unit;

a sensing part configured to sense the drain voltage based on a divided output of the second amplification unit; and a comparator circuit part configured to compare the drain voltage with the reference voltage and to sense whether an abnormality occurs in the second amplification unit.

10. The relay apparatus of claim 7, wherein the amplification device further comprises a first switch unit disposed between an input node and an input terminal of the second amplification unit to control connection or disconnection between the input node and the second amplification unit, wherein the input node connects an input terminal of the first amplification unit with the input terminal of the second amplification unit; and the controller compensates for the abnormality of the second amplification unit by controlling the first switch unit to disconnect the input node from the second amplification unit when the sensing result indicates the occurrence of the abnormality in the second amplification unit.

11. The relay apparatus of claim 7, wherein the amplification device further comprises a second switch unit disposed between an output node and an output terminal of the second amplification unit to control connection or disconnection between the output node and the output terminal of the second amplification unit, wherein the output node connects an output terminal of the first amplification unit with the output terminal of the second amplification unit; and the controller compensates for the abnormality of the second amplification unit by controlling the second switch unit to disconnect the output node from the output terminal of the second amplification unit when the sensing result indicates the occurrence of the abnormality in the second amplification unit.

* * * * *